(12) United States Patent
Steadman et al.

(10) Patent No.: US 11,317,083 B2
(45) Date of Patent: Apr. 26, 2022

(54) PIXEL CONTROL SIGNAL VERIFICATION IN A STACKED IMAGE SENSOR

(71) Applicant: SEMICONDUCTOR COMPONENTS INDUSTRIES, LLC, Phoenix, AZ (US)

(72) Inventors: Martin Jonathan Steadman, Sandhurst (GB); Simon Charles Denny, Reading (GB); Saket Sharma, Bristol (GB)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 321 days.

(21) Appl. No.: 16/565,739

(22) Filed: Sep. 10, 2019

(65) Prior Publication Data

US 2020/0252603 A1    Aug. 6, 2020

Related U.S. Application Data

(60) Provisional application No. 62/799,802, filed on Feb. 1, 2019.

(51) Int. Cl.
*H04N 5/3745* (2011.01)
*H04N 17/00* (2006.01)
*H01L 27/146* (2006.01)
*H04N 5/369* (2011.01)

(52) U.S. Cl.
CPC ..... *H04N 17/002* (2013.01); *H01L 27/14643* (2013.01); *H04N 5/3698* (2013.01); *H04N 5/3745* (2013.01)

(58) Field of Classification Search
CPC .. H04N 17/002; H04N 5/3698; H04N 5/3745; H04N 5/379; H04N 5/378; H01L 27/14643
See application file for complete search history.

(56) References Cited

U.S. PATENT DOCUMENTS

| | | |
|---|---|---|
| 2007/0103207 A1 | 5/2007 | Huang |
| 2013/0270420 A1* | 10/2013 | Park ........................ H04N 5/378 250/208.1 |
| 2013/0308029 A1 | 11/2013 | Yaghmai |
| 2014/0247366 A1 | 9/2014 | Solhusvik et al. |
| 2020/0077081 A1* | 3/2020 | Lee ........................ H04N 5/374 |

* cited by examiner

*Primary Examiner* — Mekonnen D Dagnew
(74) *Attorney, Agent, or Firm* — Treyz Law Group, P.C.; Joseph F. Guihan

(57) ABSTRACT

An image sensor may be formed from stacked first and second substrates. An array of imaging pixels and verification circuitry may be formed in the first substrate. Row control circuitry may be formed in the second substrate. The row control circuitry may provide row control signals to the array of imaging pixels. The verification circuitry may also receive the row control signals from the row control circuitry. The first substrate may include a plurality of n-channel metal-oxide semiconductor transistors and may not include any p-channel metal-oxide semiconductor transistors. The verification circuitry may include an SR latch circuit with an S node coupled to a pull-up line and an R node coupled to a pull-down transistor to ensure the SR latch circuit starts up in a set state. The verification circuitry may include a level shifter that shifts a control signal voltage when the control signal is at a low level.

14 Claims, 7 Drawing Sheets

PIXEL CONTROL SIGNAL VERIFICATION IN A STACKED IMAGE SENSOR

This application claims the benefit of provisional patent application No. 62/799,802, filed Feb. 1, 2019, which is hereby incorporated by reference herein in its entirety.

BACKGROUND

This relates generally to image sensors, and more specifically, to methods and circuitry for testing the integrity of the components in the image sensor.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

Over the lifetime of an electronic device, image sensors in the electronic device may be prone to failure. Conventional image sensors are sometimes provided with methods and circuitry for testing the functionality of the image sensor. However, including circuitry for testing the functionality of the image sensor may lead to a complex manufacturing process for the image sensor. Additionally, in conventional image sensors, a single semiconductor substrate is used for the image sensor. This may reduce the amount of space available for the pixel photodiodes.

It would therefore be desirable to be able to provide improved image sensors that include circuitry for testing the functionality of the image sensor.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
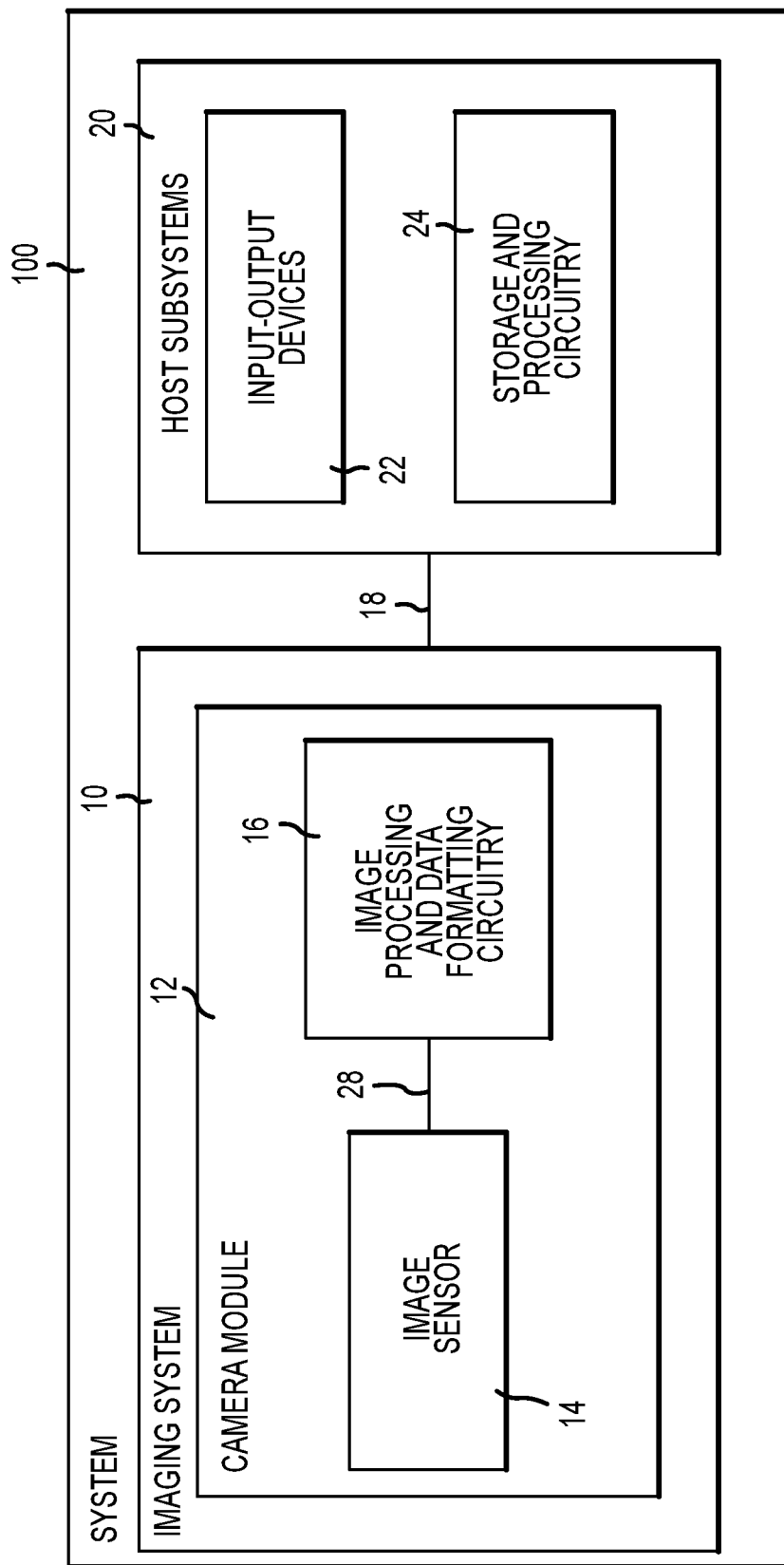
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

System 100 may be a vehicle safety system. In a vehicle safety system, images captured by the image sensor may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), a pedestrian detection system, etc. In at least some instances, an image sensor may form part of a semi-autonomous or autonomous self-driving vehicle. Vehicle safety standards may require that the proper operation of any component of a vehicle safety system (including the image sensor) be verified before, during, and/or after operation of the vehicle. Verification operations for the image sensor may be performed by the imaging system prior to, during, and/or after operation of a vehicle (e.g., upon startup and/or shutdown of the imaging system).

Figure 2:
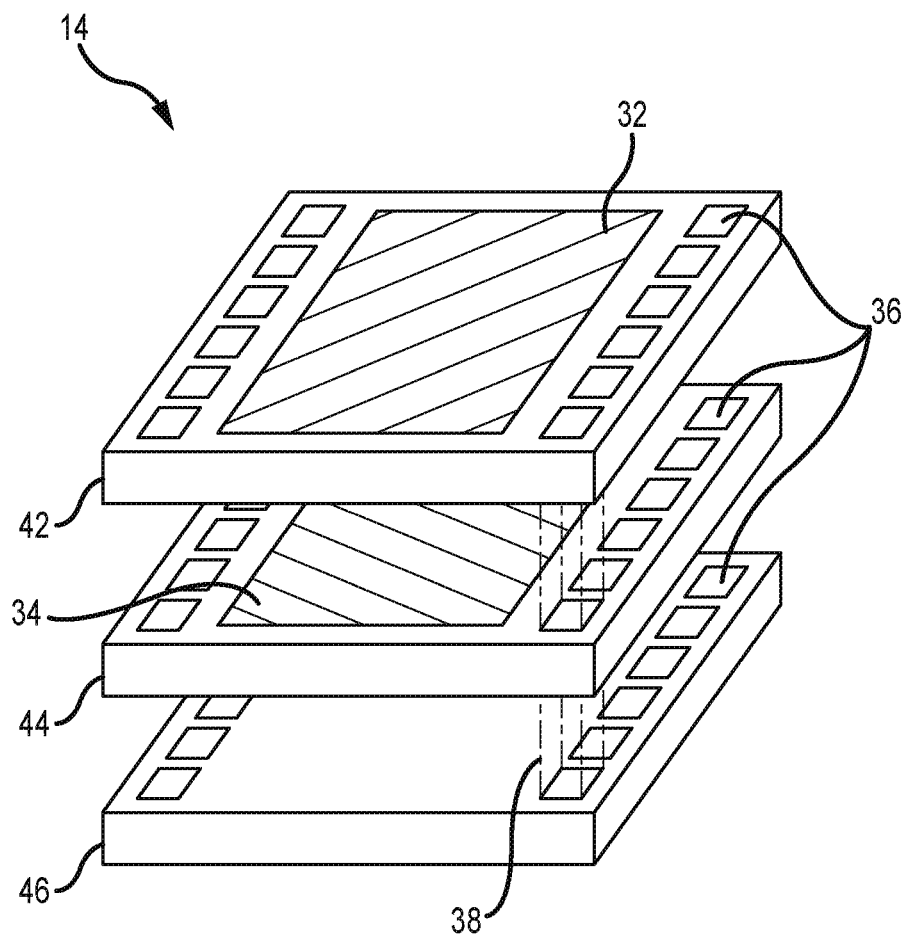
FIG. 2 is a perspective view of an illustrative image sensor formed using stacked substrates in accordance with an embodiment.

If desired, image sensor 14 may be implemented using a single semiconductor substrate. Alternatively, image sensor 14 may be implemented in a stacked-die arrangement. In the stacked-die arrangement, pixels may be formed in a substrate and readout circuitry may be formed in a separate substrate. The pixels may optionally be split between two substrates. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips. Upper chip 42 may contain the photodiodes in pixel array 32. Charge transferring transistor gates (e.g., transfer transistor 58 in FIG. 4) may also be included in upper chip 42. However, to ensure that there is adequate room for the photodiodes in upper chip 42, much of the circuitry for the image sensor may be formed in middle chip 44 and lower chip 46.

Middle chip 44 may be bonded to upper chip 42 with an interconnect layer at every pixel. For example, pixel circuitry 34 in middle chip 44 may be bonded to a Floating Diffusion (FD) that is connected to a charge transfer transistor formed in upper chip 42. Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 14 may include relevant circuitry. The upper chip may contain photodiodes and charge transferring transistor gates. The middle chip may include pixel circuitry (e.g., floating diffusion node, source follower transistor, reset transistor, etc.). The bottom chip 46 (sometimes referred to as an ASIC chip) may include one or more of clock generating circuits, pixel addressing circuits, signal processing circuits such as correlated double sampling (CDS) circuits, analog to digital converter circuits, digital image processing circuits, system interface circuits, clamp input generator circuits, clamp transistors, and clamp circuitry.

The example shown in FIG. 2 is merely illustrative. As previously mentioned, in another embodiment the image sensor may include two substrates. In this embodiment, the first substrate may include photodiodes, charge transferring transistor gates, and pixel circuitry (e.g., floating diffusion node, source follower transistor, reset transistor, etc.). The second substrate (e.g., the ASIC chip) may include one or more of clock generating circuits, pixel addressing circuits, signal processing circuits such as CDS circuits, analog to digital converter circuits, digital image processing circuits, system interface circuits, clamp input generator circuits, clamp transistors, and clamp circuitry.

Figure 3:
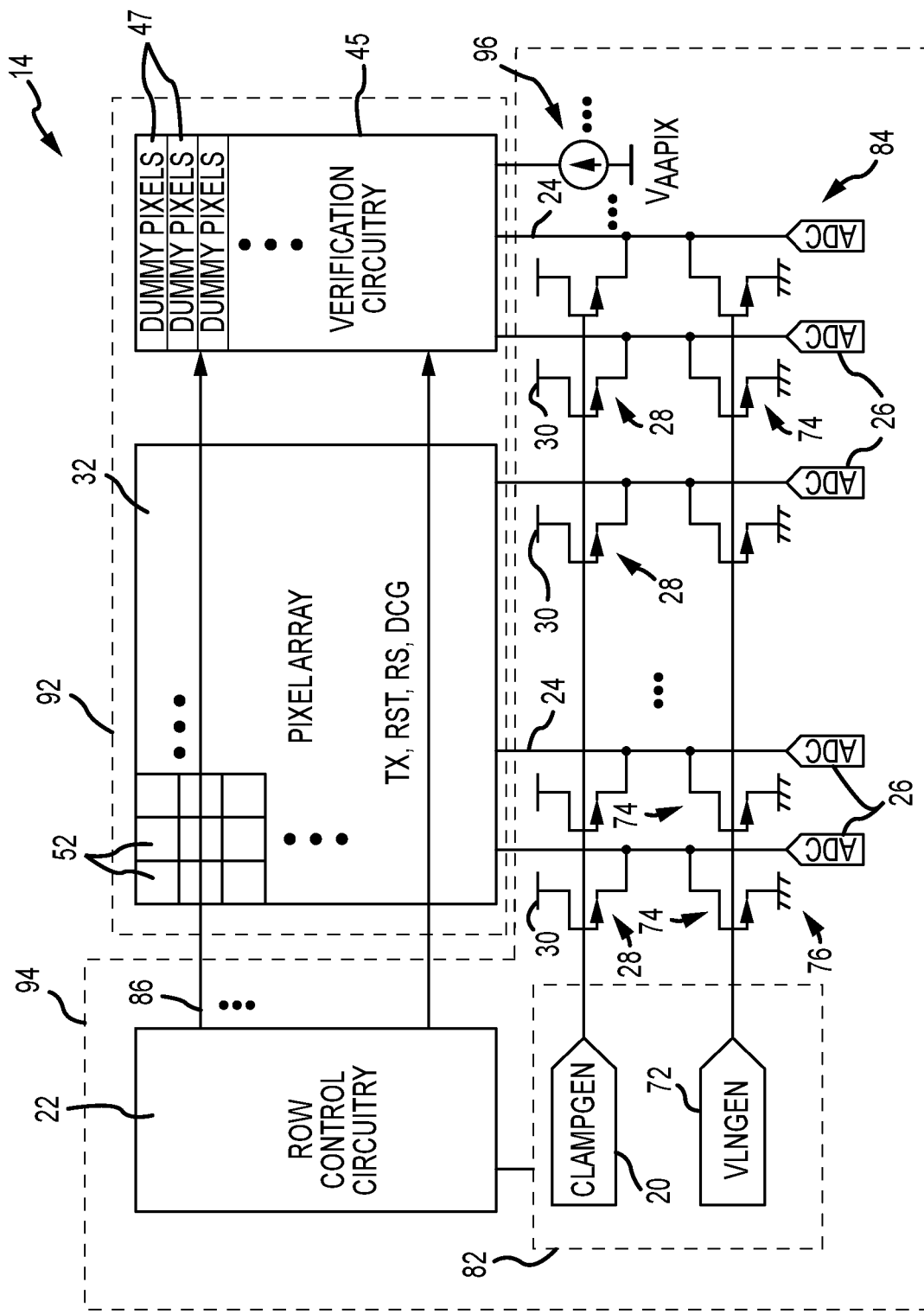
FIG. 3 is a diagram of an illustrative image sensor with a pixel array and verification circuitry formed in a first substrate and readout circuitry formed in a second substrate in accordance with an embodiment.

FIG. 3 shows an illustrative image sensor 14 that includes multiple substrates and verification circuitry. Image sensor 14 includes a pixel array such as array 32 of pixels 52 (sometimes referred to herein as image sensor pixels, imaging pixels, or image pixels 52). Image sensor 14 may sense light by converting impinging photons into electrons or holes that are integrated (collected) in sensor pixels in pixel array 32. After completion of the integration cycle, collected charge may be converted into a voltage, which may be supplied to the output terminals of image sensor 14. After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node.

As shown in FIG. 3, image sensor 14 may also include row control circuitry 22 (sometimes referred to as a row decoder/driver). Row control circuitry 22 may send control signals to pixel array 32 (e.g., over control lines 86) to control operation of pixels in pixel array 32. For example, row control circuitry 22 may send a transfer control signal (TX), a reset control signal (RST), a row select control signal (RS), and/or a dual conversion gain control signal (DCG) to pixel array 32 and/or verification circuitry 45 using control lines 86. The transfer control signal may be provided to a transfer transistor in each pixel in a given row. The reset control signal may be provided to a reset transistor in each pixel in a given row. The row select control signal may be provided to a row select transistor in each pixel in a given row. The dual conversion gain control signal may be provided to a dual conversion gain control transistor in each pixel in a given row.

Each pixel in pixel array 32 may be coupled to a corresponding column line 24. Each column line may be coupled to every pixel in a respective column of the pixel array. During operation of pixel array 32, the pixels may output the voltage that is based on the amount of light collected during the integration cycle onto column line 24 (sometimes referred to as column output line 24). Each column line 24 is coupled to a respective analog-to-digital converter (ADC) 26. The analog-to-digital converters are used to convert the voltage received from the column output line into a digital signal. Analog-to-digital converters 26 may be analog ground referred analog-to-digital converters.

In some cases, as shown in FIG. 3, the image sensor includes clamp transistors. Clamp transistors 28 may be coupled between column output line 24 and a bias voltage supply terminal 30. Bias voltage supply terminal 30 may supply a bias voltage such as $V_{AAPIX}$ or another desired bias voltage. In the example of FIG. 3, clamp transistors 28 are n-channel metal-oxide semiconductor (nMOS) transistors with a drain terminal coupled to bias voltage supply terminal 30 and a source terminal coupled to column output line 24. The gate of each clamp transistor may receive a signal from clamp input generator 20. Clamp input generator 20 may output either a ground referred clamp input or a power supply referred clamp input. During normal imaging operations (when pixel array 32 is used to collect light during integration cycles), clamp input generator 20 may output a power supply referred clamp input that is generated in reference to the power supply voltage (e.g., $V_{AAPIX}$). During testing operations (sometimes referred to as verification operations), clamp input generator 20 may output a ground referred clamp input that is generated in reference to analog ground. In some cases, using the analog ground referred clamp input may ensure high precision test inputs during testing operations.

The image sensor of FIG. 3 may also include a VLN signal generator 72 that generates a corresponding VLN signal. The VLN signal is provided to the gates of VLN transistors 74. In the example of FIG. 3, VLN transistors 74 are n-channel metal-oxide semiconductor (nMOS) transistors with a drain terminal coupled to column output line 24 and a source terminal coupled to ground 76. VLN transistors 74 and VLN signal generator 72 may form nMOS current sources used during readout and testing of pixels in the image sensor.

VLN signal generator 72 and clamp input generator 20 may be part of control and processing circuitry 82. Analog-to-digital converters 26, clamp transistors 28, and VLN transistors 74 may be considered part of column control and readout circuitry 84. Control and processing circuitry 82 may correspond to image processing and data formatting circuitry 16 in FIG. 1. Control and processing circuitry 82 may be coupled to row control circuitry 22 and may be coupled to column control and readout circuitry 84. Row control circuitry 22 may receive row addresses from control and processing circuitry 82 and may supply corresponding row control signals (e.g., TX, RST, RS, DCG) to image pixels in pixel array 32 over control paths 86 (e.g., dual conversion gain control signals, pixel reset control signals, charge transfer control signals, blooming control signals, row select control signals, or any other desired pixel control signals). Column control and readout circuitry 84 may be coupled to the columns of pixel array 32 via the column lines 24. Column lines 24 may be used for reading out image signals from image pixels and for supplying bias signals (e.g., bias currents or bias voltages) to image pixels. During image pixel readout operations, a pixel row in image pixel array 32 may be selected using row control circuitry 22 and image data associated with image pixels of that pixel row may be read out by column control and readout circuitry 84 on column lines 24.

In addition to the analog-to-digital converters, clamp input transistors, and VLN transistors shown in FIG. 3, column control and readout circuitry 84 may include column circuitry such as column amplifiers for amplifying signals read out from array 32, sample and hold circuitry for sampling and storing signals read out from array 32, column memory for storing the read out signals and any other desired data, and/or any other desired components. Column control and readout circuitry 84 may output digital pixel values to control and processing circuitry 82.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Over the lifetime of the image sensor, the image sensor may be prone to failure. Therefore, image sensor 14 in FIG. 3 may include verification circuitry 45 for testing the functionality of the image sensor. In some embodiments, verification circuitry 45 may include dummy pixels 47. Dummy pixels 47 may include some or all components of an imaging pixel from array 32 (even though the dummy pixels are not configured to measure incident light). Verification circuitry 45 may also include logic circuitry, comparison circuitry, and latch circuitry if desired. Verification circuitry 45 may include circuitry arranged in respective verification circuitry blocks. Each verification circuitry block may include one or more dummy pixels.

If desired, row control circuitry 22 and pixel array 32 may be integrated together in a single integrated circuit (as an example). Alternatively, row control circuitry 22 and pixel array 32 may be implemented in separate semiconductor substrates. In one example, as shown in FIG. 3, pixel array 32 and verification circuitry 45 may be formed in a first chip 92, whereas the additional circuitry (e.g., row control circuitry 22, clamp input generator 20, ADCs 26, etc.) is formed in a second chip 94. The first chip may sometimes be referred to as a pixel sensor chip. The second chip may be referred to as an application-specific integrated circuit (ASIC) chip. The two chips may be connected by conductive interconnect layers (e.g., hybrid bonds and/or bonds at peripheral contact pads).

In the aforementioned described embodiment where image sensor 14 is implemented using stacked chips, it may be desirable for verification circuitry (e.g., verification circuitry 45 in the pixel sensor chip) to have only nMOS (n-channel metal-oxide semiconductor) transistors. Including only nMOS transistors in the pixel sensor chip (and no pMOS transistors) may reduce the amount of implant steps to form the chip during manufacturing. Additionally, forming the pixel sensor chip with only nMOS transistors (and no pMOS transistors) may reduce contamination. Therefore, it may be desirable to use only nMOS transistors in the pixel sensor chip.

The row control circuitry 22 may provide row control signals to the image pixels for capturing image data (e.g., over control paths 86). The verification circuitry may also receive the row control signals from row control circuitry 22. The verification circuitry may identify predetermined ranges of acceptable row control signal magnitudes based on the type of row control signal and the mode of operation of the image sensor. When the output test signal is not within the determined range, an error flag may be output from the image sensor.

ASIC chip 94 may also include one or more p-channel metal-oxide semiconductor (pMOS) current sources 96 (e.g., current sources formed from one or more pMOS transistors). The pMOS current sources 96 may be used as the active load for verification circuitry 45 in the pixel sensor chip. However, to ensure that only nMOS structures are formed in pixel sensor chip 92, the pMOS current sources 96 are formed in the ASIC chip 94. Row select signals from row control circuitry 22 may be used as a power on signal for verification circuitry 45 (e.g., the row select signal may be asserted in the row being tested). For example, the row select control signal (RS) is asserted to enable testing using a given row of verification circuitry. A current source from the ASIC chip (e.g., from current source 96) may be provided only to a row that is enabled by the assertion of the row select control signal. Activating only the verification circuitry of a selected row may reduce power consumption during testing. The verification circuitry may have an nMOS source follower transistor and an nMOS row select transistor. Since the verification circuitry is within chip 92, no pMOS structures are formed in the verification circuitry.

Figure 4:
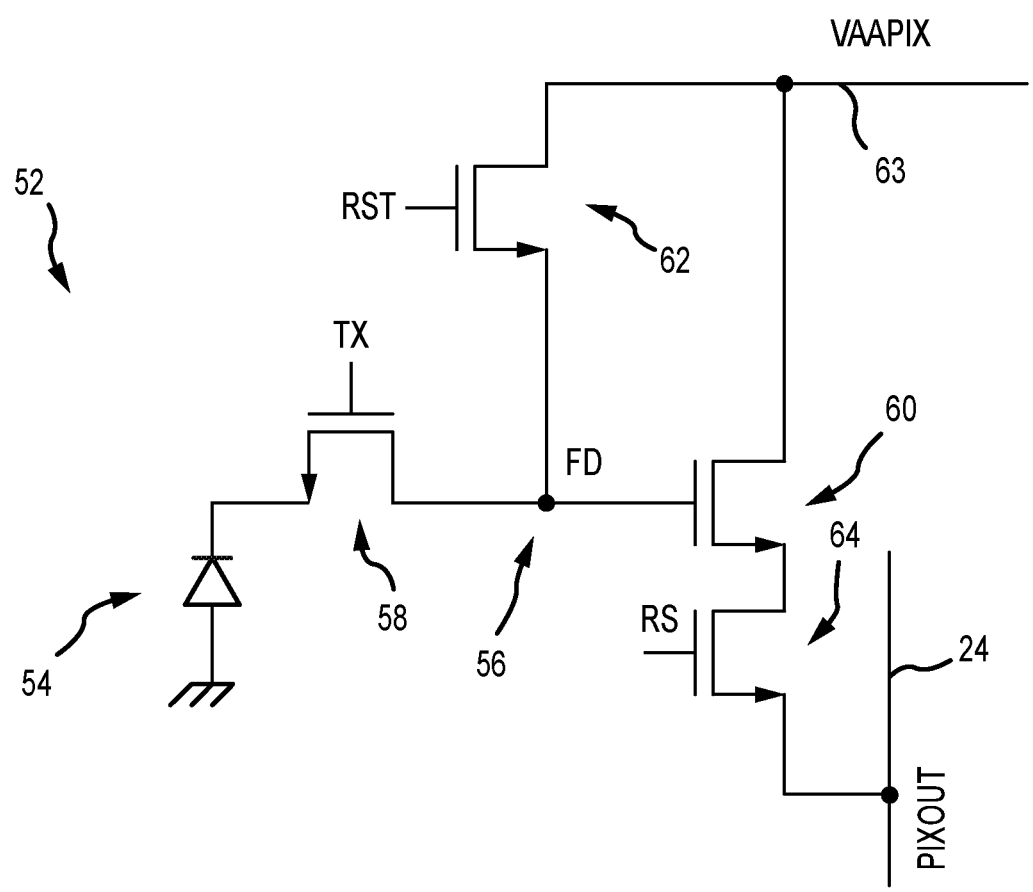
FIG. 4 is a circuit diagram of an illustrative pixel that may be included in an image sensor such as the image sensor of FIG. 3 in accordance with an embodiment.

FIG. 4 is a circuit diagram showing the structure of the pixels 52 in FIG. 3. As shown in FIG. 4, pixel 52 includes a photodiode 54, a floating diffusion region (FD) 56, and a transfer transistor 58. Photodiode 54 may sense light by converting impinging photons into electrons or holes. Transfer transistor 58 may be asserted to transfer charge from photodiode 54 to floating diffusion region 56. A row select transistor 64 is interposed between the drain of the source follower transistor 60 and column output line 24. To read out charge from floating diffusion region 56, the row select transistor 64 is asserted and the voltage corresponding to the charge at the floating diffusion region is read out on column output line 24. The floating diffusion region 56 is coupled to source follower transistor 60 and reset transistor 62. The source follower transistor is also coupled to a bias voltage supply line 63 that provides a bias voltage $V_{AAPIX}$.

After charge to voltage conversion is completed and the resulting signal transferred out from the pixels (by asserting row select transistor 64), the pixel may be reset by asserting reset transistor 62 and coupling floating diffusion region to bias voltage supply line 63. Because pixel 52 is formed in pixel sensor ship 92, all of the transistors in pixel 52 may be nMOS transistors. In other words, transfer transistor 58, reset transistor 62, source follower transistor 60, and row select transistor 64 are all nMOS transistors. The pixel structure shown in FIG. 4 is merely illustrative. If desired, pixel 52 may include any other desired pixel components in any desired configurations (e.g., one or more storage diodes, one or more storage capacitors, an anti-blooming transistor, one or more dual conversion gain transistors, one or more dual conversion gain capacitors, etc.).

Figure 5:
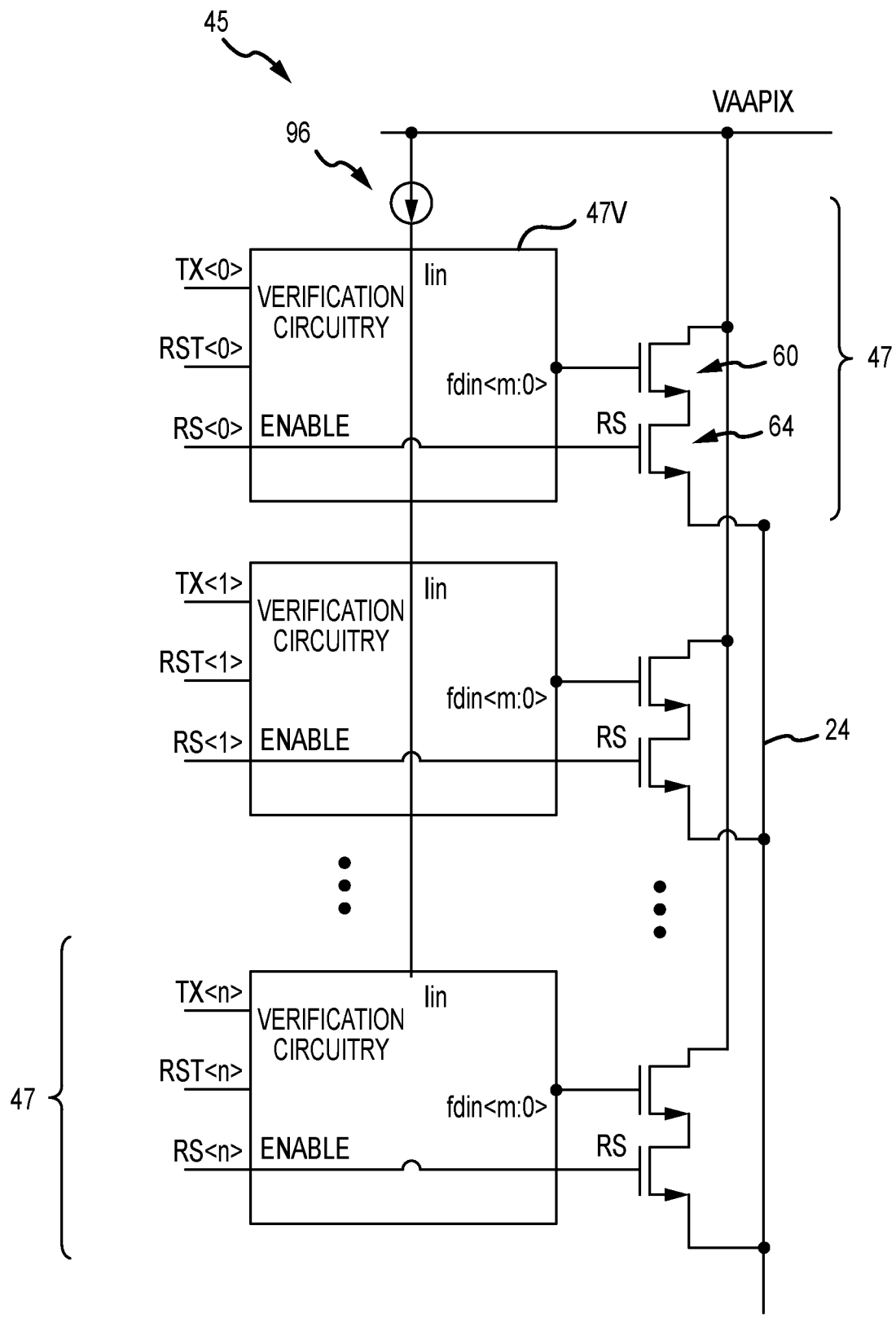
FIG. 5 is a circuit diagram of illustrative verification circuitry that may be included in an image sensor such as the image sensor of FIG. 3 in accordance with an embodiment.

FIG. 5 is a circuit diagram showing the structure of verification circuitry 45 (including dummy pixels 47) in FIG. 3. As shown in FIG. 5, each dummy pixel 47 may include a source follower transistor 60 that is coupled between $V_{AAPIX}$ and row select transistor 64. Row select transistor 64 is coupled between source follower transistor 60 and column line 24. Each dummy pixel may also include corresponding verification circuitry 47V (sometimes referred to as verification circuit 47V, verification circuitry portion 47V, or verification circuit block 47V). Verification circuitry 47V may receive control signals from row control circuitry 22 such as transfer control signal TX, reset control signal RST, and row select control signal RS. Verification circuitry 47V may also be coupled to a pMOS current source 96. The pMOS current source 96 may provide the current source for verification circuitry 47V. However, to ensure that only nMOS structures are formed in pixel chip 92 the pMOS current source is formed in ASIC chip 94 whereas verification circuitry 47V and the rest of each dummy pixel 47 is formed in pixel chip 92. As previously mentioned, row select signal RS acts as an enable signal for verification circuitry 47V. Therefore, only pixels 47 in which row select control signal RS is asserted will receive the supply current from pMOS current source 96.

To ensure that only nMOS structures are formed in pixel chip 92, source follower transistor 60 and row select transistor 64 of each dummy pixel 47 are formed from nMOS transistors. Additionally, the verification circuitry of each dummy pixel is formed from only nMOS structures.

The verification circuitry 47V of each dummy pixel may also include logic circuitry, comparison circuitry, level shifting circuitry, and/or latch circuitry if desired (e.g., an NAND gate, a NOR gate, a SR latch, etc.). The dummy pixels may be used to perform numerous tests of control signals and functionality within image sensor 14. For example, the dummy pixels may be used to perform a reset signal check. In the reset signal check, the reset signal is brought low during analog-to-digital conversion. If the reset signal is low, the FDIN node will be low during analog-to-digital conversion. If the reset signal is not low, a failure has occurred and the FDIN node will be high during analog-to-digital conversion. The reset signal check may use an NAND gate in the verification circuitry. The dummy pixels may also be used to perform a row address check. The row address check may use an NAND gate, a NOR gate, and a SR latch in the verification circuitry. The dummy pixels may also be used to perform a transfer control signal, reset control signal, row select control signal propagation check (sometimes referred to as a TX, RST, RS propagation check) with a FD binning mode. The dummy pixels may also be used to perform a dual conversion gain (DCG) mode check.

The outputs of the dummy pixels in a respective column are provided to column line 24. Column line 24 may be connected to a clamping transistor, VLN transistor, and analog-to-digital convertor as shown in FIG. 3. The ADC output may be output as either image data or a register output. The ADC output may be checked (e.g., by control and processing circuitry 82) to determine whether it is within a pre-determined range (e.g., the pre-determine range expected for the given test). When the output is not within the determined range, an error flag may be output from the image sensor (e.g., noting a failure has occurred). In general, the verification circuitry may identify predetermined ranges of acceptable control signal magnitudes based on the type of control signal (e.g., TX, RST, RS, or DCG) and the mode of operation of the image sensor. One row image pattern for each one or some columns may be output. To check a row address selected by row decoder, a unique row image pattern for each one or some rows may be outputted from ADC connected to dummy pixel columns.

In the example of FIG. 5, one column of dummy pixels is shown. This example is merely illustrative. If desired, additional columns of dummy pixels may be included in verification circuitry 45. Each column of dummy pixels may be coupled to a respective pMOS current source 96 in ASIC chip 94. In an alternate embodiment, two or more pMOS current sources may be coupled to dummy pixels in a given column.

The image sensors shown in FIG. 3 may be split between substrates in any desired manner. In one illustrative example (shown in FIG. 3), pixel array 32 and verification circuitry 45 may be formed in a first substrate (e.g., pixel sensor chip 92) while row control circuitry 22, clamp input generator 20, ADCs 26, etc. may be formed in a second substrate (e.g., ASIC chip 94). The first and second substrates may be connected by hybrid and/or peripheral bonds as shown in FIG. 2. In this example, either of the first and second substrates may include verification circuitry. However, the verification circuitry in the first substrate (with pixel and dummy pixel components) may include only nMOS transistors as described in connection with FIGS. 3 and 5.

In another illustrative example, pixel array 32 may be formed using two substrates, with at least the photodiodes in a first substrate and at least the row select transistor in a second substrate. Row control circuitry 22, clamp input generator 20, ADCs 26, etc. may be formed in a third substrate. The first, second, and third substrates may be connected by hybrid and/or peripheral bonds. In this example, any of the first, second, and third substrates may include verification circuitry. However, the verification circuitry in the first and/or second substrate (with pixel and dummy pixel components) may include only nMOS transistors as described in connection with FIGS. 3 and 5. In general, array 32, row control circuitry 22, column control and readout circuitry 84, and control and processing circuitry 82 may be split between two or more stacked substrates in any desired manner.

Figure 6:
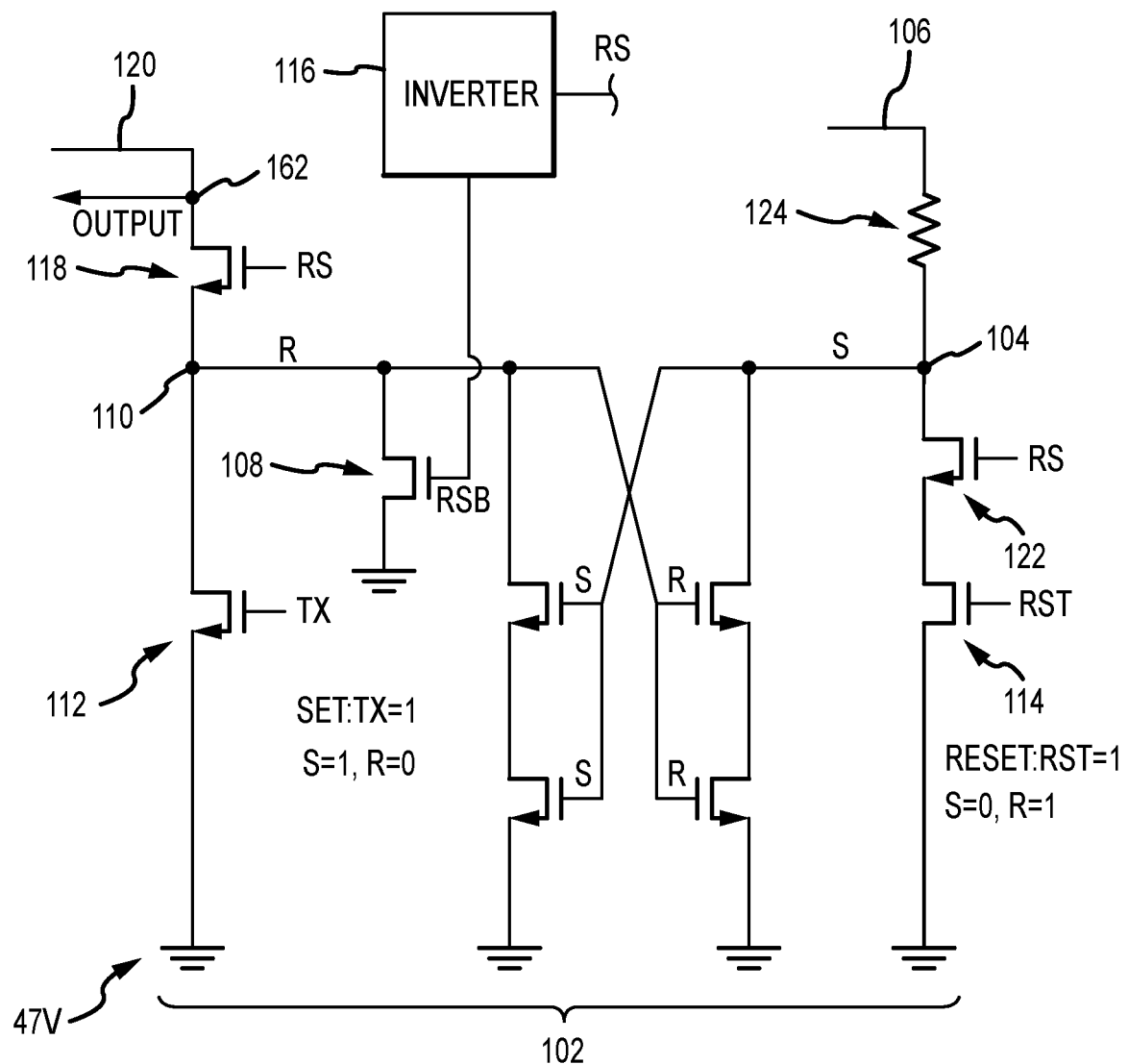
FIG. 6 is a circuit diagram of an illustrative latch circuit that may be included in the verification circuitry of an image sensor in accordance with an embodiment.

Examples of illustrative verification circuitry are shown in FIG. 6. FIG. 6 shows an illustrative verification circuit block 47V that includes latch circuit 102. Latch circuit 102 (sometimes referred to as SR latch circuit 102) is an SR latch designed to ensure that the assertion of the transfer control signal TX follows the assertion of reset control signal RST. When the row of pixels associated with the latch circuit is being tested, the latch circuit may start in a set state. When the reset control signal RST is asserted, the latch circuit is reset. The subsequent assertion of transfer control signal TX then returns the latch circuit to the set state.

Properly testing the sequential assertions of the reset control signal RST and the transfer control signal TX may require the latch circuit to start testing in the set state. However, because the latch circuit is powered down when the row associated with the latch circuit is not being read out, the latch circuit cannot respond to signals and the previous state of the latch is not retained. Consequently, if care is not taken the latch circuit can power up in either the set or reset state. If the latch circuit powers up in the reset state, verification operations may not be accurate.

Latch circuit 102 in FIG. 6 is therefore designed to ensure power up (startup) in the set state. S node 104 is coupled to a pull-up line 106 that keeps S high. Pull-up line 106 may be coupled to a pMOS current source 96 in chip 94 as shown in FIG. 3. When the latch circuit is powered up, S will be high and the latch circuit will be in the set state. Then, when the reset control signal RST is asserted, transistor 114 will be asserted, flipping the latch circuit to the reset state (e.g., asserting the reset signal RST at a logic high level results in the R node being at a logic high level and the S node being at a logic low level). Next, when transfer control signal TX is asserted, transistor 112 will be asserted, flipping the latch circuit back to the set state (e.g., asserting the transfer control signal TX at a logic high level results in the S node being at a logic high level and the R node being at a logic low level).

A pull-down transistor 108 is included to keep the R node low when the latch is deselected. Transistor 108 is coupled between the R node 110 and a ground bias supply terminal. The gate terminal of transistor 108 may receive an inverted row select signal RSB. When row select control signal RS is low, RSB will be high, ensuring transistor 108 is asserted and the R node is kept low. When row select control signal RS is high, RSB will be low, deasserting transistor 108.

In the example of FIG. 6, pull-down transistor 108 is coupled to R node 110. This example is merely illustrative. Depending upon the design of the verification circuitry, a pull-down transistor could instead or in addition be coupled to S node 104. The pull-down transistor may have a gate that receives an inverted row control signal or a normal row control signal depending upon the application.

An inverter 116 may be included to receive row select control signal RS and output inverted row select signal RSB. Inverter 116 may be an nMOS inverter (e.g., with a diode connected load or pull-up bias voltage). Inverter 116 may be shared between two or more latch circuits (e.g., multiple latch circuits associated with a given row may receive the inverted signal RSB from the inverter).

Latch circuit 102 may also include a transistor 118 coupled between R node 110 and a pull-up line 120. Pull-up line 120 may be coupled to a pMOS current source 96 in chip 94 as shown in FIG. 3. The latch circuit of FIG. 6 may have an output node 162. The output from the latch circuit may be provided from output node 162 to additional logic circuitry and/or to a floating diffusion node of a dummy pixel (e.g., as shown in FIG. 5) to ensure the RST and TX signals are asserted in the proper order. Latch circuit 102 may also include a transistor 122 that is interposed between S node 104 and transistor 114. Transistors 118 and 122 may both receive row control signal RS at their gate terminals. Transistors 118 and 122 therefore serve as enable transistors. The latch circuit may only operate when RS is asserted. Resistor 124 may be included between pull-up line 106 and S node 104. Resistor 124 may optionally be omitted.

The locations of enable transistors 118 and 122 in FIG. 6 are merely illustrative. In some cases, the enable transistors 118 and/or 122 may be at different positions within the depicted circuit. For example, in one illustrative alternate embodiment, enable transistor 122 may be positioned in the place of resistor 124 (e.g., between S node 104 and pull-up line 106).

The pull-up line 106 coupled to S node 104 may help ensure that latch circuit 102 powers up in the set state (by keeping the S node high). The pull-down transistor 108 coupled to R node 110 may also help ensure that latch circuit 102 powers up in the set state (by keeping the R node low). In other words, when latch circuit 102 starts up (e.g., when transistors 118 and 122 are asserted to enable operation of the latch circuit), the S node will be high and the R node will be low, ensuring the SR latch circuit is in the set state.

Pull-up lines 106 and 120 (sometimes referred to as bias voltage supply lines, pull-up bias lines, pull-up bias voltage lines, etc.) may be coupled to a pMOS current source such as pMOS current source 96 in FIGS. 3 and 5. Because only nMOS transistors may be formed in first chip 92, the pMOS current sources may be formed in the second chip while the remaining latch circuitry shown in FIG. 6 is formed in the first chip.

In FIG. 6, the S node is coupled to the gate of two S transistors that are in series. Similarly, the R node is coupled to the gate of two R transistors that are in series. This example is merely illustrative. If desired, the S node and R node may only be coupled to the gate of one transistor instead of to two transistors in series, may be coupled to the gates of two transistors that are coupled in parallel, etc. In general, the S and R transistors of the SR latch circuit may have any desired arrangement.

Figure 7:
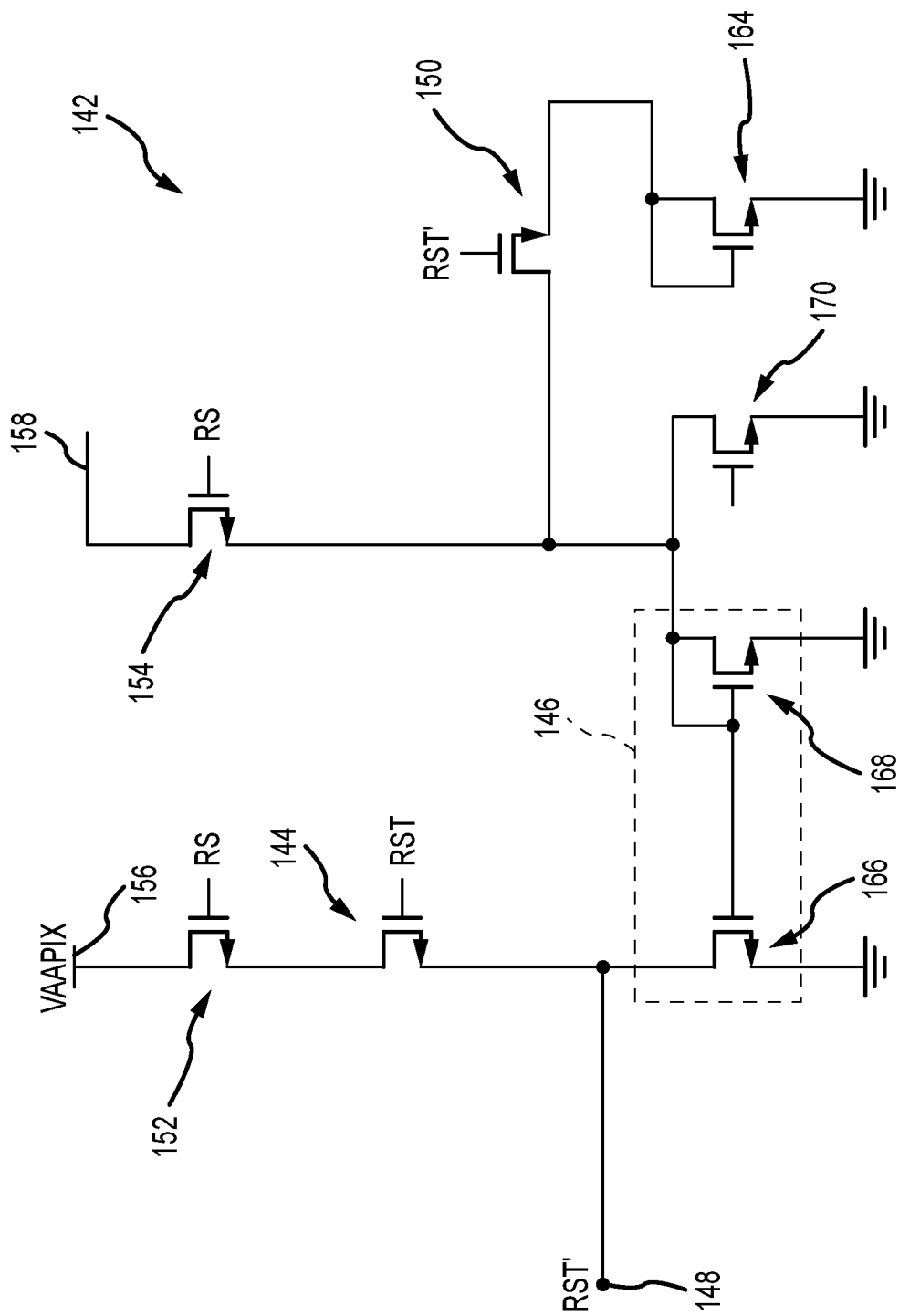
FIG. 7 is a circuit diagram of an illustrative level shifter that may be used to shift control signals closer to ground at low logic levels in accordance with an embodiment.

Some pixel row control signals may have a logic low level that is somewhat above ground. This can lead to unwanted leakage current and/or logic failure. To account for these logic low level signals above ground, verification circuitry in image sensor 14 may also include a level shifter that is used to make non-zero logic low levels closer to ground. FIG. 7 shows an illustrative level shifter that may be included in the verification circuitry. The level shifter may shift the low level closer to ground. However, it is desirable for the high level to be unaffected by the level shifter. Therefore, the level shifter may be designed to not shift the signal when received at a high level (or to shift the signal by a lesser amount when the signal is at the high level).

The reset control signal RST may need to be shifted closer to ground to optimize performance of the image sensor. FIG. 7 shows an illustrative level shifter 142 that receives reset control signal RST at a gate terminal of transistor 144. Transistor 144 is an nMOS source follower that is used as a down level shifter. The nMOS source follower transistor 144 uses a bias current to ground to operate. A current mirror 146 fed with a reference current via pull-up line 158 may be used to provide the bias current for nMOS source follower transistor 144. Pull-up line 158 may be coupled to a pMOS current source 96 in chip 94 as shown in FIG. 3. Current mirror 146 may include transistors 166 and 168. The output node 148 of the level shifter (e.g., coupled to the source of transistor 144) may output the shifted reset control signal RST'. The reset control signal may be shifted from an input voltage (RST) of 0.8V to an output voltage (RST') of 0.2V, for example.

To stop the reset signal from being shifted at high logic levels (sometimes referred to as high levels, logic level high, logic high level, etc.), the bias current may be reduced when the reset signal is high. When the reset signal is high, transistor 150 (which receives the shifted reset signal RST' at its gate terminal) may be asserted. Asserting transistor 150 adds transistor 164 (which has a gate and drain both coupled to pull-up line 158 through transistors 154 and 150) to the current from the pull-up line 158. Adding transistor 164 lowers the reference current provided to the current mirror and correspondingly reduces the bias current applied to source follower transistor 144.

The amount that the control signal RST is shifted may be proportional to the reference current provided to the current mirror. Therefore, reducing the reference current when RST is high results in RST being shifted less at the logic high level than at the logic low level (sometimes referred to as low level, low logic level, logic level low, etc.). In one example, the voltage of the control signal may be shifted by more than 0.2 V, by more than 0.3 V, by more than 0.4 V, by more than 0.5 V, by more than 0.6 k V, by between than 0.4 V and 0.8 V, or by between 0.5 and 0.7 V when at the logic low level. The voltage of the control signal may be shifted by less than 0.1 V, by less than 0.2 V, by less than 0.3 V, by less than 0.6 V, by between than 0.001 V and 0.2 V, or by between 0.05 and 0.1 V when at the logic high level.

Transistor 152 may be interposed between bias voltage supply terminal 156 (that provides bias voltage $V_{AAPIX}$) and transistor 144. Transistor 154 may be interposed between pull-up line 158 and current mirror 146. Transistors 152 and 154 may receive the row select control signal RS at their gate terminals. Accordingly, the transistors 152 and 154 may serve as enable transistors that prevent the level shifter from operating unless the row control signal associated with the level shifter is asserted.

The level shifter 142 may also include a transistor 170 that is used to power down the level shifter. Transistor 170 may therefore sometimes be referred to as power down transistor 170.

The example of shifting reset control signal RST in FIG. 7 is merely illustrative. Any desired control signal (e.g., TX) may be provided to the gate terminal of transistor 144 and therefore shifted using the level shifter. The shifted control signal (e.g., RST') may be provided to additional verification circuit blocks within the verification circuitry (e.g., the latch circuit of FIG. 6).

To summarize, an image sensor may include verification circuitry. The verification circuitry may be formed from nMOS transistors and may be formed in first chip 92. The verification circuitry may include a level shifter that is configured to shift a control signal (e.g., a reset control signal) closer to ground at low levels. At high levels, the level shifter may not shift the control signal by as much as at low levels. The shifted control signal may be provided to additional verification circuitry to ensure proper operation of the imaging pixels. The verification circuitry may also include a latch circuit that tests whether the reset control signal (RST) and transfer control signal (TX) are being asserted in the proper order. The latch circuitry may receive the shifted reset control signal RST' from the level shifter in one example. To ensure the latch circuit powers up in the set state, a pull-up line may be coupled to the S node of the latch and a pull-down transistor may be coupled to the R node of the latch. The pull-down transistor may receive an inverted row control signal from an inverter to ensure that the pull-down transistor is asserted when the row control signal is deasserted. By including circuitry to always power up the latch circuitry in the set state, proper verification operations may be ensured.

In various embodiments, an image sensor may include first and second substrates, an array of imaging pixels in the first substrate, each imaging pixel having a photodiode, row control circuitry in the second substrate that is configured to provide row control signals to the array of imaging pixels, and verification circuitry in the first substrate that receives the row control signals from the row control circuitry. The first substrate may include a plurality of n-channel metal-oxide semiconductor transistors and may not include any p-channel metal-oxide semiconductor transistors.

The image sensor may also include a current source coupled to the verification circuitry. The current source may be a p-channel metal-oxide semiconductor current source. The p-channel metal-oxide semiconductor current source may be formed in the second substrate. The verification circuitry may include a plurality of dummy pixels, each dummy pixel may have a respective verification circuitry portion, and each dummy pixel may receive a row select control signal from the row control circuitry that selectively enables the respective verification circuit portion for that dummy pixel. Only the verification circuitry portions of dummy pixels that are enabled by the row select control signal may receive current from the current source.

Each imaging pixel may include a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor. The plurality of dummy pixels may include at least one column of dummy pixels and each column of dummy pixels in the at least one column of dummy pixels may be coupled to a respective column output line. Each column output line may be coupled to a respective analog-to-digital converter.

In various embodiments, an image sensor may include first and second substrates, an array of imaging pixels in the first substrate arranged in a plurality of rows and a plurality of columns, a plurality of dummy pixels in the first substrate arranged in a plurality of rows and at least one column, and row control circuitry in the second substrate. The row control circuitry may be configured to provide a respective control signal to each row of imaging pixels and each row of dummy pixels, the control signal may selectively enable verification circuitry in each dummy pixel, and the first substrate may not include any p-channel metal-oxide semiconductor transistors.

The image sensor may also include a current source coupled to the verification circuitry in each dummy pixel in a first column of dummy pixels. The current source may include at least one p-channel metal-oxide semiconductor transistor. The current source may be formed in the second substrate. Only the verification circuitry that has been enabled by the control signal may receive current from the current source. Each imaging pixel may include a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor. A gate of the row select transistor of each imaging pixel may receive the control signal from the row control circuitry.

In various embodiments, an image sensor may include a first substrate that includes an array of imaging pixels that includes a plurality of n-channel metal-oxide semiconductor transistors and does not include any p-channel metal-oxide semiconductor transistors and verification circuitry that includes a plurality of n-channel metal-oxide semiconductor transistors and does not include any p-channel metal-oxide semiconductor transistors and a second substrate that is overlapped by the first substrate and that includes a current source coupled to the verification circuitry that includes at least one p-channel metal-oxide semiconductor transistor and row control circuitry in the second substrate. The row control circuitry may be configured to provide a first row control signal to a first row of imaging pixels in the array of imaging pixels and a first portion of the verification circuitry and the first row control signal may control whether the first portion of the verification circuitry receives current from the current source.

The first row control signal may be provided to a gate of a row select transistor in each imaging pixel of the first row of imaging pixels. The row control circuitry may be configured to provide a second row control signal to the first row of imaging pixels and the first portion of the verification circuitry and the second row control signal may be provided to a gate of a transfer transistor in each imaging pixel of the first row of imaging pixels. The row control circuitry may be configured to provide a third row control signal to the first row of imaging pixels and the first portion of the verification circuitry and the third row control signal may be provided to a gate of a reset transistor in each imaging pixel of the first row of imaging pixels.

In various embodiments, an image sensor may include an array of imaging pixels and verification circuitry configured to test operation of the array of imaging pixels. The verification circuitry may have an SR latch circuit associated with a given row of imaging pixels and the SR latch circuit may include a first node that is coupled to a pull-up bias line that is configured to ensure the SR latch circuit starts in a set state.

The first node may be an S node for the SR latch circuit and the SR latch circuit may include an R node. The SR latch circuit may also include a first transistor coupled to the R node that has a gate that receives a transfer control signal associated with the given row of imaging pixels and a second transistor coupled to the S node that has a gate that receives a reset control signal associated with the given row of imaging pixels. The SR latch circuit may be configured to verify that the reset control signal and the transfer control signal are asserted in a correct order. The SR latch circuit may be formed in a first substrate, the first substrate may include a plurality of n-channel metal-oxide semiconductor (nMOS) transistors and may not include any p-channel metal-oxide semiconductor (pMOS) transistors, and the pull-up bias line may be coupled to a pMOS current source that is formed in a second substrate. The SR latch circuit may also include a pull-down transistor that is coupled to the R node and that is configured to ensure the SR latch circuit starts in the set state and an inverter that receives a row select control signal associated with the given row of imaging pixels and that outputs an inverted version of the row select control signal. The pull-down transistor may have a gate that receives the inverted version of the row select control signal.

In various embodiments, an image sensor may include an array of imaging pixels and verification circuitry configured to test operation of a given row of imaging pixels. The verification circuitry may include an inverter that receives a row select control signal associated with the given row of imaging pixels and that outputs an inverted version of the row select control signal and an SR latch circuit associated with the given row of imaging pixels. The SR latch circuit may include a first node that is coupled to a pull-down transistor and the pull-down transistor may have a gate that receives the inverted version of the row select control signal.

The SR latch circuit may also include a first transistor coupled to the R node that has a gate that receives a transfer control signal associated with the given row of imaging pixels and a second transistor coupled to the S node that has a gate that receives a reset control signal associated with the given row of imaging pixels. The SR latch circuit may be configured to verify that the reset control signal and the transfer control signal are asserted in a correct order. The S node may be coupled to a pull-up bias line, the pull-down transistor may be configured to keep the R node low when the SR latch circuit is not being used, and the pull-up bias line may be configured to keep the S node high when the SR latch circuit is not being used. The SR latch circuit may be formed in a first substrate and the first substrate may include a plurality of n-channel metal-oxide semiconductor (nMOS) transistors and may not include any p-channel metal-oxide semiconductor (pMOS) transistors.

In various embodiments, an image sensor may include an array of imaging pixels that includes a given row of imaging pixels, row control circuitry configured to provide a control signal to the given row of imaging pixels, and verification circuitry configured to test operation of the array of imaging pixels. The verification circuitry may include a level shifter that is configured to receive the control signal, shift a voltage of the control signal by a first amount when the control signal is at a low level, and shift the voltage of the control signal by a second amount that is less than the first amount when the control signal is at a high level.

The control signal received by the level shifter may be a reset control signal associated with the given row of imaging pixels. The level shifter may comprise a source follower transistor, the source follower transistor may have a gate that receives the control signal, and the source follower transistor may have a drain that outputs a shifted version of the control signal based on a bias current. The level shifter may also include a current mirror that provides the bias current for the source follower transistor. The current mirror may be fed by a reference current that is provided by a pull-up bias line. The level shifter may also include a first transistor that is coupled to the pull-up bias line in parallel with the current mirror and a second transistor that is coupled between the pull-up bias line and the first transistor and that has a gate that receives the shifted version of the control signal. The level shifter may be formed in a first substrate and the first substrate may include a plurality of n-channel metal-oxide semiconductor (nMOS) transistors and may not include any p-channel metal-oxide semiconductor (pMOS) transistors.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
an array of imaging pixels; and
verification circuitry configured to test operation of the array of imaging pixels, wherein the verification circuitry has an SR latch circuit associated with a given row of imaging pixels and wherein the SR latch circuit includes a first node that is coupled to a pull-up bias line that is configured to ensure the SR latch circuit starts in a set state.

2. The image sensor defined in claim 1, wherein the first node is an S node for the SR latch circuit and wherein the SR latch circuit includes an R node.

3. The image sensor defined in claim 2, wherein the SR latch circuit further comprises:
a first transistor coupled to the R node, wherein the first transistor has a gate that receives a transfer control signal associated with the given row of imaging pixels; and
a second transistor coupled to the S node, wherein the second transistor has a gate that receives a reset control signal associated with the given row of imaging pixels.

4. The image sensor defined in claim 3, wherein the SR latch circuit is configured to verify that the reset control signal and the transfer control signal are asserted in a correct order.

5. The image sensor defined in claim 3, wherein the SR latch circuit is formed in a first substrate, wherein the first substrate includes a plurality of n-channel metal-oxide semiconductor (nMOS) transistors and does not include any p-channel metal-oxide semiconductor (pMOS) transistors, and wherein the pull-up bias line is coupled to a pMOS current source that is formed in a second substrate.

6. The image sensor defined in claim 2, wherein the SR latch circuit further comprises:
a pull-down transistor that is coupled to the R node and that is configured to ensure the SR latch circuit starts in the set state.

7. The image sensor defined in claim 6, further comprising:
an inverter that receives a row select control signal associated with the given row of imaging pixels and that outputs an inverted version of the row select control signal, wherein the pull-down transistor has a gate that receives the inverted version of the row select control signal.

8. An image sensor comprising:
an array of imaging pixels; and
verification circuitry configured to test operation of a given row of imaging pixels, wherein the verification circuitry comprises:
an inverter that receives a row select control signal associated with the given row of imaging pixels and that outputs an inverted version of the row select control signal; and
an SR latch circuit associated with the given row of imaging pixels, wherein the SR latch circuit includes a first node that is coupled to a pull-down transistor and wherein the pull-down transistor has a gate that receives the inverted version of the row select control signal.

9. The image sensor defined in claim 8, wherein the first node is an R node for the SR latch circuit and wherein the SR latch circuit also includes an S node.

10. The image sensor defined in claim 9, wherein the SR latch circuit further comprises:
a first transistor coupled to the R node, wherein the first transistor has a gate that receives a transfer control signal associated with the given row of imaging pixels; and
a second transistor coupled to the S node, wherein the second transistor has a gate that receives a reset control signal associated with the given row of imaging pixels.

11. The image sensor defined in claim 10, wherein the SR latch circuit is configured to verify that the reset control signal and the transfer control signal are asserted in a correct order.

12. The image sensor defined in claim 9, wherein the S node is coupled to a pull-up bias line, wherein the pull-down transistor is configured to keep the R node low when the SR latch circuit is not being used, and wherein the pull-up bias line is configured to keep the S node high when the SR latch circuit is not being used.

13. The image sensor defined in claim 8, wherein the SR latch circuit is formed in a first substrate and wherein the first substrate includes a plurality of n-channel metal-oxide semiconductor (nMOS) transistors and does not include any p-channel metal-oxide semiconductor (pMOS) transistors.

14. An image sensor comprising:
an array of imaging pixels; and
verification circuitry blocks configured to test operation of the array of imaging pixels, wherein each verification circuitry block is associated with a respective row of imaging pixels and wherein each verification circuitry block comprises:
an SR latch circuit, wherein the SR latch circuit includes a first node that is coupled to a pull-up bias line that is configured to ensure the SR latch circuit starts in a set state.

* * * * *